United States Patent
Takenaga et al.

(10) Patent No.: US 10,236,223 B2
(45) Date of Patent: Mar. 19, 2019

(54) SUBSTRATE PROCESSING METHOD, PROGRAM, APPARATUS AND SYSTEM TO DETERMINE SUBSTRATE PROCESSING RESULT

(71) Applicant: Tokyo Electron Limited, Tokyo (JP)

(72) Inventors: Yuichi Takenaga, Iwate (JP); Takanori Saito, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 420 days.

(21) Appl. No.: 14/659,921

(22) Filed: Mar. 17, 2015

(65) Prior Publication Data

US 2015/0270183 A1 Sep. 24, 2015

(30) Foreign Application Priority Data

Mar. 19, 2014 (JP) .................................. 2014-056827

(51) Int. Cl.
*G01N 37/00* (2006.01)
*H01L 21/66* (2006.01)
*H01L 21/67* (2006.01)

(52) U.S. Cl.
CPC ........ *H01L 22/20* (2013.01); *H01L 21/67248* (2013.01); *H01L 21/67253* (2013.01)

(58) Field of Classification Search
CPC ......... H01L 21/67248; H01L 21/67253; H01L 22/20
USPC ........................................................ 702/81
See application file for complete search history.

(56) References Cited

U.S. PATENT DOCUMENTS

| | | | |
|---|---|---|---|
| 6,211,094 B1* | 4/2001 | Jun | H01L 22/26 257/E21.528 |
| 6,869,892 B1* | 3/2005 | Suzuki | C23C 8/10 257/E21.285 |
| 2004/0159284 A1* | 8/2004 | Sakamoto | H01L 21/67253 118/712 |
| 2004/0238519 A1* | 12/2004 | Sakamoto | F27D 19/00 219/390 |

(Continued)

FOREIGN PATENT DOCUMENTS

JP 2004-140348 A 5/2004

*Primary Examiner* — Duy T Nguyen
(74) *Attorney, Agent, or Firm* — Abelman, Frayne & Schwab

(57) ABSTRACT

Disclosed is a substrate processing method. The substrate processing method includes: a first acquisition step of acquiring a first processing condition in a first processing performed using a first number of monitor substrates and a first processing result related to the monitor substrates; a second acquisition step of acquiring a second processing condition in a second processing performed using a second number of monitor substrates and a second processing result related to the monitor substrates; a first calculation step of calculating a processing condition difference between the first processing condition and the second processing condition; and a second calculation step of calculating a processing result of substrates at slot positions where no monitor substrate is placed in the first processing, based on the first processing result, the second processing result, the processing condition difference, and a process model representing a relationship between a processing condition and a processing result.

6 Claims, 11 Drawing Sheets

(56) References Cited

U.S. PATENT DOCUMENTS

| | | | |
|---|---|---|---|
| 2007/0195853 A1* | 8/2007 | Park | C23C 16/46 374/1 |
| 2008/0075838 A1* | 3/2008 | Inoue | C23C 8/10 427/58 |
| 2009/0029486 A1* | 1/2009 | Ueno | C23C 16/46 438/5 |
| 2009/0232967 A1* | 9/2009 | Takenaga | C23C 16/402 427/9 |
| 2013/0260328 A1* | 10/2013 | Takenaga | F27D 19/00 432/9 |
| 2014/0373387 A1* | 12/2014 | Asari | H01L 21/67109 34/549 |

\* cited by examiner

FIG.6A

| Heater Temperature [°C] | |
|---|---|
| Zone 1 | 501 |
| Zone 2 | 501 |
| Zone 3 | 501 |
| Zone 4 | 501 |
| Zone 5 | 501 |

FIG.6B

| Slot Position | Average Film Thickness [nm] |
|---|---|
| Wm1 | 99.4 |
| Wm2 | 99.5 |
| Wm3 | 99.4 |
| Wm4 | 99.5 |
| Wm5 | 99.4 |
| Wm6 | 99.5 |
| Wm7 | 99.5 |

FIG.6C

| Heater Temperature [°C] | |
|---|---|
| Zone 1 | 500 |
| Zone 2 | 500 |
| Zone 3 | 500 |
| Zone 4 | 500 |
| Zone 5 | 495 |

FIG.6D

| Slot Position | Average Film Thickness [nm] |
|---|---|
| Wm1 | 99.0 |
| Wm2 | 99.0 |
| Wm3 | 99.0 |
| Wm4 | 99.0 |
| Wm5 | 99.0 |
| Wm6 | 99.0 |
| Wm8 | 99.6 |
| Wm7 | 99.0 |

SUBSTRATE PROCESSING METHOD, PROGRAM, APPARATUS AND SYSTEM TO DETERMINE SUBSTRATE PROCESSING RESULT

CROSS-REFERENCE TO RELATED APPLICATIONS

This application is based on and claims priority from Japanese Patent Application No. 2014-056827, filed on Mar. 19, 2014, with the Japan Patent Office, the disclosure of which is incorporated herein in its entirety by reference.

TECHNICAL FIELD

The present disclosure relates to a substrate processing method, a program, a control device, a substrate processing apparatus, and a substrate processing system.

BACKGROUND

In manufacturing a semiconductor device, a batch type substrate processing apparatus for collectively processing a plurality of substrates, for example, semiconductor wafers (wafers), is used. Recently, according to a demand for high integration of semiconductor devices, it is requested that wafers be processed with good inter-plane uniformity. Although the batch type substrate processing apparatus may efficiently process a plurality of semiconductor wafers, it is difficult to ensure the inter-plane uniformity.

In general, a substrate processing process using the batch type substrate processing apparatus performs a substrate processing in a state where a monitor substrate for monitoring a processing result are arranged in addition to substrates for products. Then, for example, a processing condition is optimized based on a processing result of the monitor substrate.

SUMMARY

As a measure, there is provided a substrate processing method for performing a substrate processing in a state in which at least a monitor substrate is arranged in a substrate holding mechanism having a plurality of slots. The substrate processing method includes: a first acquisition step of acquiring a first processing condition in a first processing performed using a first number of monitor substrates and a first processing result related to the monitor substrates; a second acquisition step of acquiring a second processing condition in a second processing performed using a second number of monitor substrates, in which the second number is larger than the first number, and a second processing result related to the monitor substrates; a first calculation step of calculating a processing condition difference between the first processing condition and the second processing condition; and a second calculation step of calculating a processing result of substrates at slot positions where no monitor substrate is placed in the first processing, based on the first processing result, the second processing result, the processing condition difference, and a process model representing a relationship between a processing condition and a processing result.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 6A to 6D are explanatory views illustrating an exemplary substrate processing method according to the present exemplary embodiment.

DETAILED DESCRIPTION

Figure 1:
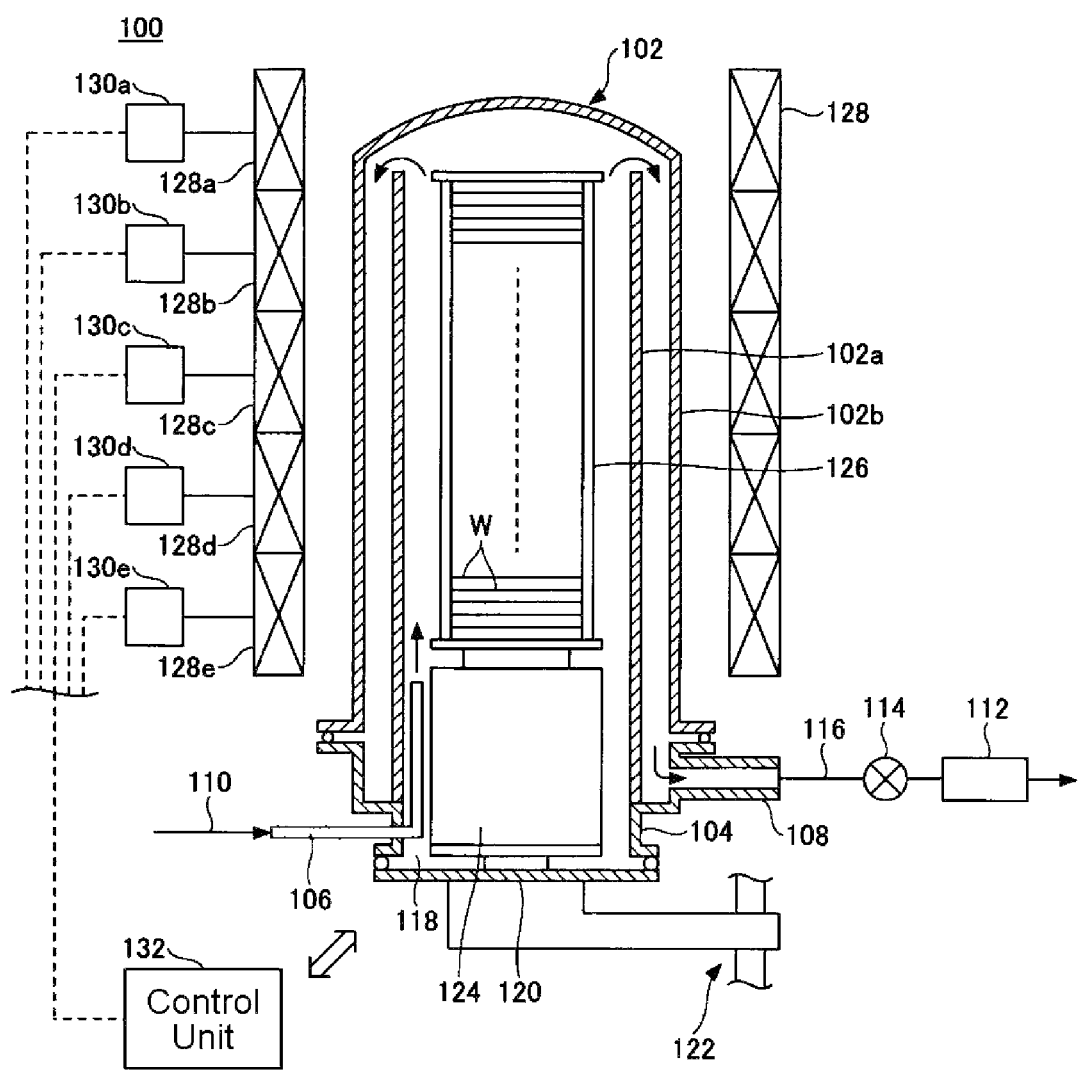
FIG. 1 is a schematic view illustrating an exemplary configuration of a substrate processing apparatus according to an exemplary embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In order to process a plurality of substrates with good inter-plane uniformity, a plurality of monitor substrates may be arranged so as to check processing results and to optimize a processing condition. However, when the plurality of monitor substrates are arranged, manufacturing costs increase.

Therefore, one solution of the present disclosure is to provide a substrate processing method which allows a substrate processing result to be determined using a small number of monitor substrates.

According to an aspect of the present disclosure, there is provided a substrate processing method for performing a substrate processing in a state in which at least a monitor substrate is arranged in a substrate holding mechanism having a plurality of slots. The substrate processing method includes: a first acquisition step of acquiring a first processing condition in a first processing performed using a first number of monitor substrates and a first processing result related to the monitor substrates; a second acquisition step of acquiring a second processing condition in a second pro- cessing performed using a second number of monitor substrates, in which the second number is larger than the first number, and a second processing result related to the monitor substrates; a first calculation step of calculating a processing condition difference between the first processing condition and the second processing condition; and a second calculation step of calculating a processing result of substrates at slot positions where no monitor substrate is placed in the first processing, based on the first processing result, the second processing result, the processing condition difference, and a process model representing a relationship between a processing condition and a processing result.

In the substrate processing method described above, the second calculation step includes: calculating a correction film thickness for correcting a processing result difference caused by the processing condition difference, based on the second processing result, the processing condition difference, and the process model; and calculating the processing result of the substrate at the slot position where no monitor substrate is placed in the first processing, based on the correction film thickness and the first processing result.

In the substrate processing method described above, slot positions where the monitor substrates are placed in the second processing include slot positions where the monitor substrates are placed in the first processing.

In the substrate processing method described above, at least some of the slot positions where no monitor substrate is placed in the first processing are the slot positions where the monitor substrates are placed in the second processing.

In the substrate processing method described above, the processing condition includes a heater temperature.

In the substrate processing method described above, the processing includes a film forming process on the monitor substrates, and the processing result includes film thicknesses of films formed on the monitor substrates.

The substrate processing method may further include a step of updating or optimizing the processing condition, based on the calculated processing result of the substrates at the slot positions where no monitor substrate is placed and the first processing result.

According to another aspect of the present disclosure, there is provided a computer-readable storage medium which stores a program that executed in a computer so as to cause the computer to execute the substrate processing method described above.

According to still another aspect of the present disclosure, there is provided a control device for controlling an operation of a substrate processing apparatus including a substrate holding mechanism provided with a plurality of slots in which at least monitor substrate are arranged. The control device includes: a recipe storage unit configured to store a first processing condition in a first processing performed using a first number of monitor substrates and a first processing result related to the monitor substrates and a second processing condition in a second processing performed using a second number of monitor substrates, in which the second number is larger than the first number, and a second processing result related to the monitor substrates; and a model storage unit configured to store a process model representing a relationship between a processing condition and a processing result. The control device is configured to calculate a processing result of the substrate at a slot position where no monitor substrate is placed in the first processing, based on the first processing result and the second processing result stored in the recipe storage unit, the process model stored in the model storage unit, and a processing condition difference between the first processing condition and the second processing condition.

According to still another aspect of the present disclosure, there is provided a substrate processing apparatus including a substrate holding mechanism having a plurality of slots in which at least monitor substrates are arranged and a control unit. The substrate processing apparatus is capable of processing a plurality of substrates. The control device includes: a recipe storage unit configured to store a first processing condition in a first processing performed using a first number of monitor substrates and a first processing result related to the monitor substrates and a second processing condition in a second processing performed using a second number of monitor substrates, in which the second number is larger than the first number, and a second processing result related to the monitor substrates; and a model storage unit configured to store a process model representing a relationship between a processing condition and a processing result. The control device is configured to calculate a processing result of the substrate at a slot position where no monitor substrate is placed in the first processing, based on the first processing result and the second processing result stored in the recipe storage unit, the process model stored in the model storage unit, and a processing condition difference between the first processing condition and the second processing condition.

According to yet another aspect of the present disclosure, there is provided a substrate processing apparatus including a substrate holding mechanism having a plurality of slots in which at least monitor substrates are arranged, the substrate processing apparatus being capable of processing a plurality of substrates; and a control unit configured to control the substrate processing apparatus. The control device includes: a recipe storage unit configured to store a first processing condition in a first processing performed using a first number of monitor substrates and a first processing result related to the monitor substrates and a second processing condition in a second processing performed using a second number of monitor substrates, in which the second number is larger than the first number, and a second processing result related to the monitor substrates; and a model storage unit configured to store a process model representing a relationship between a processing condition and a processing result. The control device is configured to calculate a processing result of the substrate at a slot position where no monitor substrate is placed in the first processing, based on the first processing result and the second processing result stored in the recipe storage unit, the process model stored in the model storage unit, and a processing condition difference between the first processing condition and the second processing condition.

According to an aspect of the present disclosure, a substrate processing method, which allows a substrate processing result to be determined, using a small number of monitor substrates, may be provided.

Hereinafter, exemplary embodiments of the present disclosure will be described with reference to the accompanying drawings. Meanwhile, in the present specification and the drawings, constituent elements having substantially the same functional configuration will be designated by the same reference numeral and redundant descriptions thereof will be omitted.

[Overall Configuration of Substrate Processing Apparatus]

First, a substrate processing apparatus 100 according to the present exemplary embodiment will be described with reference to FIG. 1. FIG. 1 illustrates a schematic exemplary configuration of the substrate processing apparatus 100 according to the present exemplary embodiment.

The substrate processing apparatus 100 according to the present exemplary embodiment includes a processing container 102 which is formed of, for example, quartz and extends in a vertical direction. The processing container 102 is configured as, for example, a double pipe structure which includes a cylindrical inner vessel 102a and a ceilinged outer vessel 102b concentrically arranged outside the inner vessel 102a.

A lower end of the processing container 102 is hermetically sealed by a manifold 104 formed of, for example, stainless steel. The manifold 104 may be configured so as to be fixed to a base plate (not illustrated).

The manifold 104 includes a gas introduction part 106 configured to introduce a processing gas or inert gas (e.g., N2 gas) to the processing container 102, and a gas exhaust part 108 configured to evacuate the interior of the processing container 102. Although FIG. 1 illustrates a configuration in which a single gas introduction part 106 is installed, the present disclosure is not limited thereto. A configuration having a plurality of gas introduction parts 106 may be provided based on, for example, the number of gas species to be used.

The kind of a processing gas is not specially limited and may be appropriately selected by those skilled in the art according to, for example, the kind of a film to be formed. For example, in a case where a silicon oxide ($SiO_2$) film is formed on a substrate such as, for example, a semiconductor wafer, the processing gas may include dichlorosilane ($SiH_2Cl_2$) and dinitrogen monoxide ($N_2O$).

The gas introduction part 106 is connected with a pipe 110 for introduction of various gases as described above. Meanwhile, the pipe 110 is provided with, for example, a flow rate control unit such as, for example, a mass-flow controller (not illustrated), or a valve (not illustrated) so as to control the flow rate of each gas.

In addition, the gas exhaust part 108 is connected with a pipe 116 formed as a vacuum exhaust path which includes, for example, a vacuum pump 112 capable of controlling reduction of pressure within the processing container 102 or an opening-variable valve 114.

The manifold 104 includes a furnace opening 118 formed at a lower end thereof and the furnace opening 118 is provided with a disc-shaped cover 120 formed of, for example, stainless steel. The cover 120 is installed to be movable upward and downward by an elevating mechanism 122 and configured to hermetically seal the furnace opening 118.

A heat conservation vessel 124 made of, for example, quartz is installed on the cover 120. In addition, a wafer boat 126 made of, for example, quartz, is placed on the heat conservation vessel 124. The wafer boat 126 is configured to horizontally maintain, for example, 25 to 175 wafers W at predetermined intervals in multiple stages.

The wafer boat 126 is carried into the processing container 102 by raising the cover 120 using the elevating mechanism 122 and, after the processing, the wafer boat 126 is carried out from the processing container 102 by lowering the cover 120.

The wafer boat 126 has a plurality of longitudinal slots (support grooves) and the respective wafers W are horizontally loaded to the slots to be vertically spaced apart from each other. A group of wafers arranged in the wafer boat 126 constitutes a single batch and various substrate processings are performed on each batch.

Figure 2:
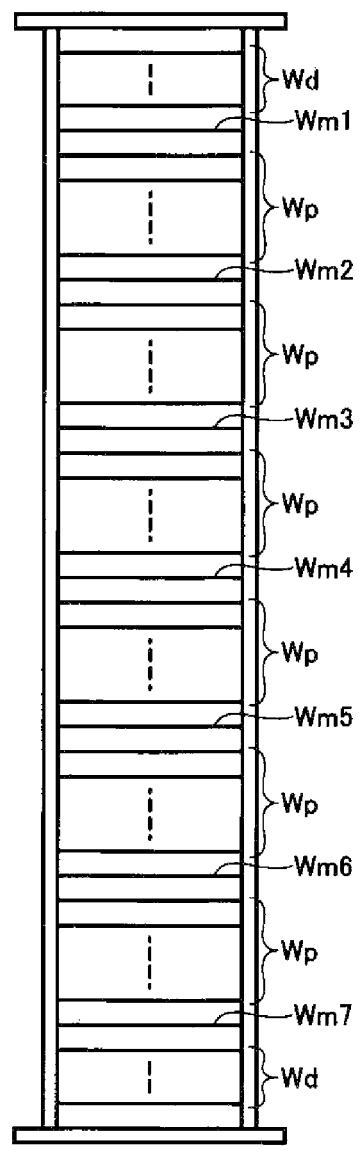
FIG. 2 is a schematic view illustrating an exemplary wafer boat in which wafers are disposed.

FIG. 2 is a schematic view illustrating an exemplary wafer boat 126 in which wafers W are arranged. Meanwhile, an upward direction of the wafer boat 126 illustrated in FIG. 2 corresponds to an upward direction of the substrate processing apparatus 100 as described above. In addition, a downward direction of the wafer boat 126 corresponds to a downward direction of the substrate processing apparatus 100 as described above. In addition, in the present exemplary embodiment, for convenience of description, slot positions of the wafer boat 126 are numbered 1, 2, 3, . . . in sequence from the top to the bottom.

In general, the wafer boat 126 is occasionally divided into three parts which are called a top region, a center region, and a bottom region in sequence from the top of the wafer boat 126.

For example, the wafers W including product wafers Wp, monitor wafers Wm, and dummy wafers Wd are arranged in the wafer boat 126.

The product wafers Wp are wafers W used for manufacturing semiconductor devices.

The monitor wafers Wm are wafers W used for checking whether wafers W (in particular, the product wafers Wp) have been subjected to a desired substrate processing. Then, for example, adjustment of a processing condition in the subsequent processing is performed based on the processing result of the monitor wafers Wm.

The monitor wafers Wm are equal to or substantially equal to the product wafers Wp in order to match the processing condition thereof with that of the product wafers Wp.

The monitor wafers Wm are arranged to be distributed in the longitudinal direction of the wafer boat 126 (the vertical direction of FIG. 2). For example, FIG. 2 illustrates an example in which seven monitor wafers Wm1, Wm2, Wm3, Wm4, Wm5, Wm6, and Wm7 are provided in sequence from the top of the wafer boat 126. However, the present disclosure is not limited thereto and less than seven monitor wafers Wm or more than eight monitor wafers Wm may be provided. Hereinafter, slot positions where the monitor wafers Wm are placed are called measurement slot positions and slot positions where the monitor wafers Wm are not placed are called non-measurement slots positions.

The wafers W, placed in an upper end region and a lower end region of the wafer boat 126, are more easily thermally unbalanced than the wafers W placed in the central portion. Therefore, in order to perform, for example, a temperature compensation of the (product) wafers W placed in the upper end region and the lower end region, the dummy wafers Wd are placed in the upper end region and the lower end region of the wafer boat 126.

Generally, six or seven dummy wafers Wd are placed in the upper end region and the lower end region of the wafer boat 126.

In addition, when there are fewer product wafers Wp than the number of slots of the wafer boat 126, empty regions where no wafers W are arranged are present in the wafer boat 126. In this case, the temperature of wafers or the concentration of a processing gas become locally uneven, causing deterioration in face-to-face uniformity and in-plane uniformity of a processing. For this reason, the wafer boat 126 may occasionally be fully loaded using the dummy wafers Wd corresponding to the empty regions of the slots.

In general, as the number of monitor wafers Wm arranged in the wafer boat 126 increases, the processing state of the processed wafer group may be monitored with high precision. Therefore, even if a desired processing result is not obtained, a processing condition of the subsequent processing may be adjusted with high precision.

In terms of manufacturing costs, the number of monitor wafers Wm arranged on the wafer boat 126 may be reduced. As the number of monitor wafers W is reduced, the consumption of monitor wafers Wm is reduced, and thus, the costs caused by the monitor wafers Wm may be reduced. In addition, since more product wafers Wp may be arranged, the number of product wafers Wp to be processed per one batch may be increased.

In addition, a heater 128 having, for example, a cylindrical shape, is installed around the outer circumference of the processing container 102 to heat the processing container 102 to a predetermined temperature in a controlled manner.

The heater 128 is divided into a plurality of zones, for example, five zones (hereafter referred to as zone 1, zone 2, zone 3, zone 4, and zone 5 from the top of FIG. 1). In addition, respective heaters 128a to 128e are configured such that outputs thereof are independently controlled by power controllers 130a to 130e, respectively.

Figure 3:
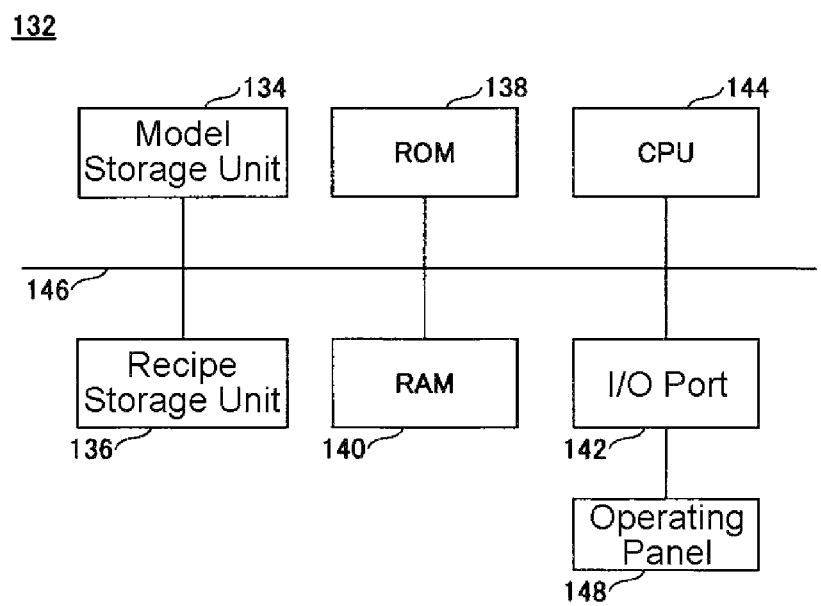
FIG. 3 is a schematic view illustrating an exemplary configuration of a control unit according to the present exemplary embodiment.

In addition, the substrate processing apparatus 100 according to the present exemplary embodiment includes a control unit 132, as illustrated in FIG. 1. FIG. 3 is a schematic view illustrating an exemplary configuration of the control unit 132 according to the present exemplary embodiment.

As illustrated in FIG. 3, the control unit 132 includes a model storage unit 134, a recipe storage unit 136, a read only memory (ROM) 138, a random access memory (RAM) 140, an I/O port 142, a CPU 144, and a bus 146 for interconnecting the aforementioned components.

The model storage unit 134 stores a process model representing a relationship between a predetermined processing condition and a processing result when a substrate is processed under the predetermined processing condition. A temperature-film thickness model representing the effect of, for example, a heater temperature on the film thickness of a formed film (the amount of a film formed on a wafer W) is stored as the process model.

The recipe storage unit 136 stores a processing condition to determine a control sequence according to the kind of a substrate processing to be executed in the substrate processing apparatus 100. The processing condition is a recipe prepared for each process that the user practically performs. For example, the recipe specifies, for example, pressure variation, gas supply initiation and stop timings of, for example, a processing gas, and the supply amount of the processing gas from the carry-in of wafers W to the substrate processing apparatus 100 to the carry-out of processed wafers W. In addition, the recipe is updated based on a set temperature profile determined by the above-described process model and a thermal model.

In addition, the recipe storage unit 136 stores a processing result related to a monitor substrate.

The ROM 138 is configured as, for example, an electrically erasable programmable read only memory (EEPROM), a flash memory, or a hard disk, and is a storage medium that stores, for example, an operating program of the CPU 144.

The RAM 140 functions as, for example, a work area of the CPU 144.

The I/O port 142 supplies a measured signal related to processing conditions such as, for example, a temperature, a pressure, and the flow rate of a gas, to the CPU 144, and outputs a control signal output from the CPU 44 to each component (for example, a controller (not illustrated) of the opening-variable valve 114, the power controller 130, and the mass flow controller). In addition, the I/O port 142 is connected to an operating panel 148 that allows the user to operate the substrate processing apparatus 100.

The CPU 144 executes an operating program stored in the ROM 138 and controls an operation of the substrate processing apparatus 100 according to a processing condition stored in the recipe storage unit 136 in response to an instruction from the operating panel 148.

In addition, the CPU 44 calculates a processing result of a wafer W at a slot position where no monitor wafer W is placed, based on the process model stored in the model storage unit 134, the processing condition stored in the recipe storage unit 136, and the processing result, as described below.

The bus 146 transmits information between the respective components.

[Inter-Plane Uniformity in Substrate Processing Using Batch Type Substrate Processing Apparatus]

Next, inter-plane uniformity of films formed on the wafers W arranged in the wafer boat 126 will be described with reference to FIG. 4. In the present exemplary embodiment, for simplicity, inter-plane uniformity of films obtained in a case where a film forming process is performed as a substrate processing under a predetermined temperature condition will be described.

Figure 4:
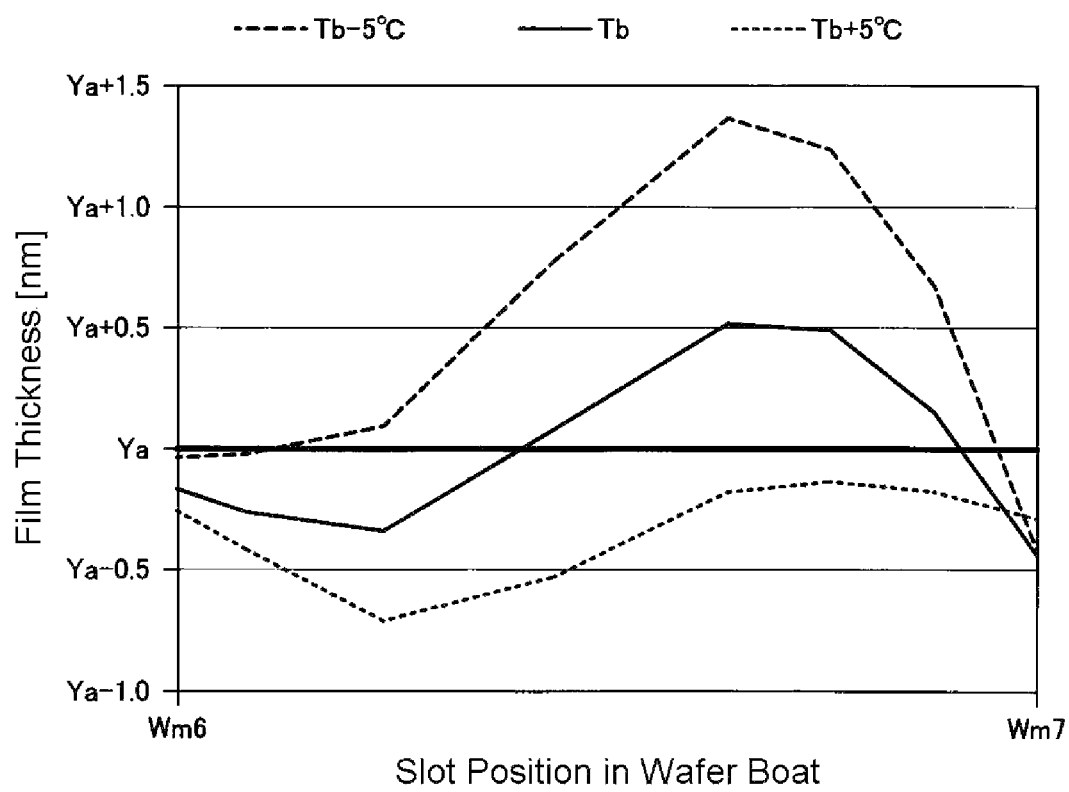
FIG. 4 is a schematic view illustrating inter-plane uniformity of films formed on wafers.

FIG. 4 is a schematic view illustrating inter-plane uniformity of films formed on the wafers W. More specifically, FIG. 4 is view illustrating a distribution of thicknesses of films formed on the monitor wafer Wm6, the monitor wafer Wm7, and wafers W interposed between these monitor wafers Wm after a predetermined film forming processing was performed.

In addition, in the example of FIG. 4, aiming to form a film having a film thickness Ya (nm) (the thick solid line of FIG. 4) on each wafer W, a film forming processing was performed by setting the temperature of the heater 128e of the zone 5 to predetermined three temperatures, i.e. Tb° C. (solid line), Tb−5° C. (dashed line), and Tb+5° C. (dotted line).

In FIG. 4, for example, reference is made to the film thicknesses of films formed on the monitor wafer Wm6 and the monitor wafer Wm7. In this case, even under any one processing condition in which the set temperature of the heater 128e is Tb° C., Tb−5° C., or Tb+5° C., the film thicknesses of the films formed on the monitor wafer Wm6 and the monitor wafer Wm7 are within a range of 0.5 nm from a target film thickness Ya.

Meanwhile, reference is made to the film thicknesses of films formed on the wafers W interposed between the monitor wafer Wm6 and the monitor wafer Wm7. In this case, it may be determined that a processing condition in which the set temperature of the heater 128e is Tb° C. is a condition that is the most similar to the target film thickness Ya and has a less in inter-plane film thickness variation (good inter-plane uniformity).

This means that, in a conventional case where a small number of monitor wafers Wm are arranged in a single batch, the film thickness of a film formed on the wafer W at a non-measurement slot position may not be precisely determined. In particular, as illustrated in FIG. 4, in a case where the film thickness varies or undulates between slot positions, it is particularly difficult to determine the film thickness of a film formed on a wafer W placed at a non-measurement slot position. In particular, the bottom region of the wafer boat 126 tends to increase variation or undulation in film thickness.

Therefore, when a processing condition of a subsequent processing based on a result of a substrate processing using a small number of monitor wafers Wm, an adjustment, in which undulation or variation in film thickness as described above is taken into concentration, may not be made. As a result, the wafers W may not be processed in the subsequent processing with good inter-plane uniformity.

However, the inventors of the present disclosure have discovered a substrate processing apparatus 100 in which a processing result of a wafer W at a slot where no monitor wafer Wm is placed may be precisely determined even if a small number of monitor wafers Wm are used. Thus, based on the precise processing result of the wafers W acquired using the substrate processing apparatus 100 according to the present exemplary embodiment, a processing condition of a subsequent processing may be adjusted or optimized. As a result, inter-plane uniformity may be improved in a subsequent substrate processing performed using the adjusted or optimized processing condition.

[Substrate Processing Method]

Figure 5:
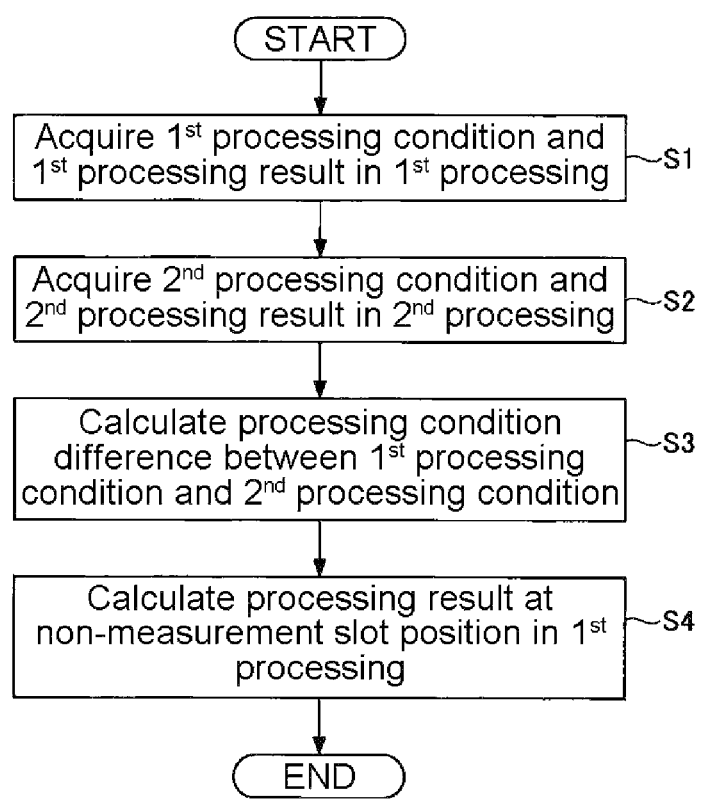
FIG. 5 is a flowchart illustrating an exemplary substrate processing method according to the present exemplary embodiment.

Next, a substrate processing method of the above-described substrate processing apparatus 100 will be described. FIG. 5 is a flowchart illustrating an exemplary substrate processing method according to the present exemplary embodiment.

A substrate processing method according to the present exemplary embodiment performs a substrate processing in a state in which at least a monitor substrate is arranged in a substrate holding mechanism having a plurality of slots. The substrate processing method includes: a first acquisition step of acquiring a first processing condition in a first processing performed using a first number of monitor substrates and a first processing result related to the monitor substrates; a second acquisition step of acquiring a second processing condition in a second processing performed using a second number of monitor substrates, in which the second number is larger than the first number, and a second processing result related to the monitor substrates; a first calculation step of calculating a processing condition difference between the first processing condition and the second processing condition; and a second calculation step of calculating a processing result of substrates at slot positions where no monitor substrate is placed in the first processing, based on the first processing result, the second processing result, the processing condition difference, and a process model representing a relationship between a processing condition and a processing result.

Hereinafter, respective steps will be described.

In the following description, although a case where seven (a first number) monitor wafers Wm are arranged in the wafer boat 126 in a first processing and eight (a second number) monitor wafers Wm are arranged in the wafer boat 126 in a second processing will be described, the present disclosure is not limited thereto. The first number and the second number are selected such that the second number is larger than the first number. For example, the first number may be three and the second number may be thirteen.

In addition, in the following description, slot positions where the monitor wafers Wm are placed are referred to as Wm.

In the first processing, seven monitor wafers Wm are distributed and placed at slot positions Wm1, Wm2, Wm3, Wm4, Wm5, Wm6, and Wm7 of the wafer boat 126 as illustrated in FIG. 2.

In the second processing, seven monitor wafers Wm are distributed and placed at the slot positions Wm1, Wm2, Wm3, Wm4, Wm5, Wm6, and Wm7 of the wafer boat 126 as illustrated in FIG. 2 and one monitor wafer Wm is placed at a slot position Wm8 between the slot position Wm6 and the slot position Wm7. That is, in the second processing, the monitor wafers Wm are arranged at the slot positions Wm1, Wm2, Wm3, Wm4, Wm5, Wm6, and Wm7 where the monitor wafers Wm are arranged in the first processing and at the slot position Wm8 where no monitor wafer Wm is placed in the first processing. Then, descriptions will be made an example of calculating the film thickness of a film formed on the wafer W placed at the slot position Wm8 in the first processing.

In the present exemplary embodiment, the heater temperature is selected as a processing condition and the film thickness is selected as a processing result, by way of an example. However, the present exemplary embodiment is not limited thereto. The processing condition may include, for example, temperature, pressure, gas flow rate, time, or combinations thereof. In addition, the processing result may include, for example, the concentration of impurities in a film, etch rate, or combinations thereof.

Next, respective steps will be described in detail.

(S1) Step of Acquiring a First Processing Condition and a First Processing Result in the First Processing In the present step, the heater temperature in each zone and the film thicknesses of films formed on the monitor wafers Wm in the first processing are acquired.

FIG. 6A illustrates an exemplary relationship between the zones and the heater temperatures in the first processing. In FIG. 6B illustrates a relationship between the slot positions of the wafer boat 126 and an average film thickness that is an exemplary film thickness of films formed on the monitor wafers Wm arranged in the wafer boat 126.

As illustrated in FIG. 6A, the heater temperatures of zone 1 to zone 5 are set to, for example, 501° C. Meanwhile, although the heater temperatures of zone 1 to zone 5 are set to the same temperature for simplicity of description, they may be set to different temperatures.

As illustrated in FIG. 6B, the film thickness of films formed on the monitor wafers Wm placed at the slot positions Wm1, Wm3 and Wm5 is 99.4 nm and the film thickness of films formed on the monitor wafers Wm placed at the slot positions Wm2, Wm4, Wm6 and Wm7 is 99.5 nm.

(S2) Step of Acquiring a Second Processing Condition and a Second Processing Result in the Second Processing In the present step, the heater temperature in each zone and the film thicknesses of films formed on the monitor wafers W in the second processing are acquired.

FIG. 6C illustrates an exemplary relationship between the zones and the heater temperatures in the second processing. FIG. 6D illustrates a relationship between slot positions of the wafer boat 126 and an average film thickness that is an exemplary film thickness of films formed on the monitor wafers Wm arranged in the wafer boat 126.

As illustrated in FIG. 6C, the heater temperatures of zone 1 to zone 4 are set to, for example, 500° C., and the heater temperature of zone 5 is set to, for example, 495° C.

As illustrated in FIG. 6D, the film thickness of films formed on the monitor wafers Wm placed at the slot positions Wm1, Wm2, Wm3, Wm4, Wm5, Wm6 and Wm7 is 99.0 nm and the film thickness of a film formed on the monitor wafer Wm placed at the slot position Wm8 is 99.6 nm.

(S3) Step of Calculate a Difference in Processing Condition Between the First Processing Condition and the Second Processing Condition In the present step, a temperature difference between the heater temperature in the first processing and the heater temperature in the second processing is calculated for each zone.

Figure 7A:
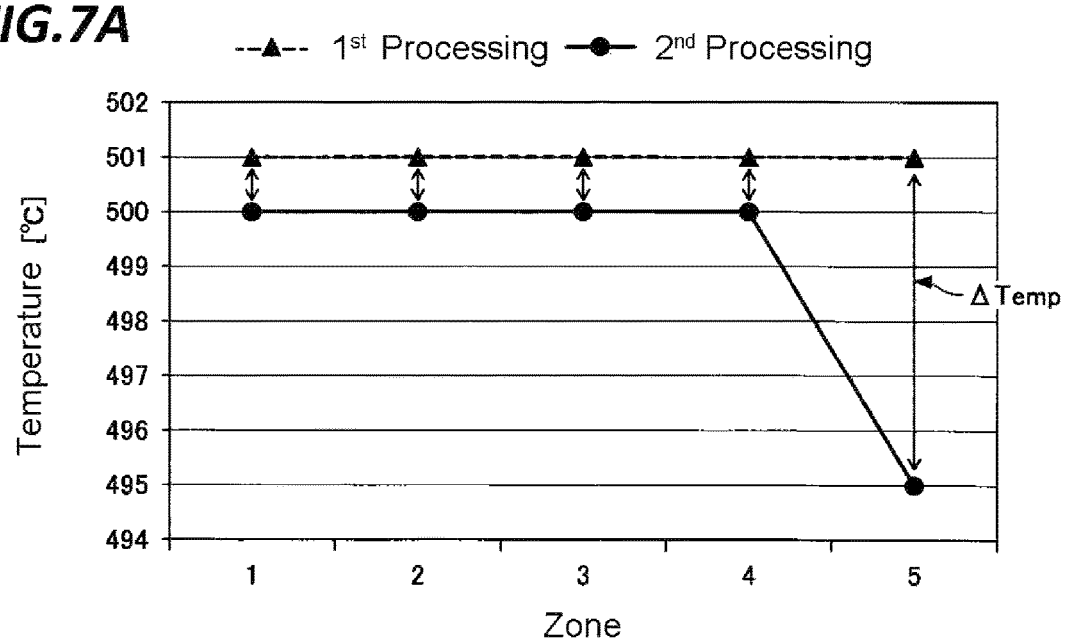
FIGS. 7A and 7B are explanatory views illustrating an exemplary substrate processing method according to the present exemplary embodiment.

FIG. 7A illustrates an exemplary relationship between the zones and the heater temperatures in the first processing and the second processing. In FIG. 7A, the horizontal axis represents zone and the vertical axis represents temperature. Meanwhile, in the drawings subsequent to FIGS. 7A and 7B, black plots are actually measured values and white or asterisk plots are values calculated or estimated by the control unit 132. In addition, lines between the plots are those obtained by linear interpolation between adjacent plots (actually measured values).

In the present step, as illustrated in FIG. 7A, a difference ΔTemp between the heater temperature (black triangular marks) in the first processing and the heater temperatures (black circular marks) in the second processing is calculated for each of zones 1 to 5 (see the arrows in the drawing). Meanwhile, in the present exemplary embodiment, the difference ΔTemp in each of zones 1 to 4 is 1° C. and the difference ΔTemp in zone 5 is 6° C.

(S4) Step of Calculating a Processing Result at a Non-Measurement Slot Position in the First Processing In step S4, descriptions will be made on the step of calculating the film thickness of a film formed on the product wafer Wp placed at the non-measurement slot position Wm8 in the first processing with reference to FIG. 7B, FIGS. 8A and 8B, and FIGS. 9A and 9B.

In the present step, first, assuming that the film thickness at the slot position Wm8 in the second processing has not been measured, the film thickness at the slot position Wm8 in the second processing is estimated.

Figure 7B:
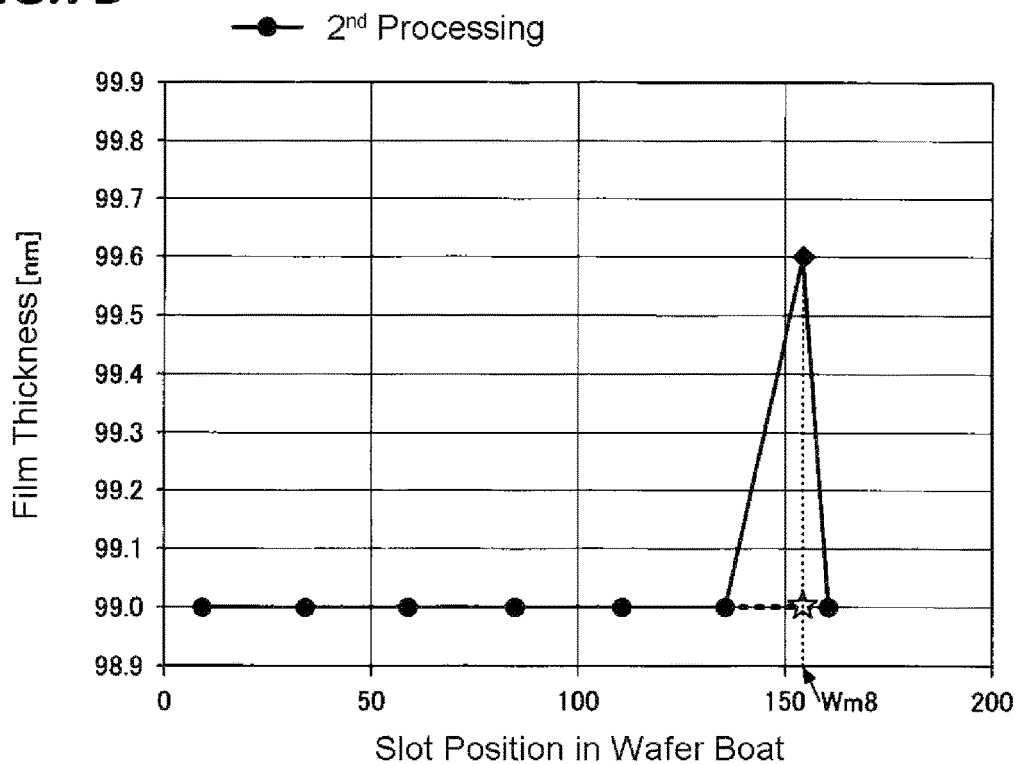

FIG. 7B illustrates an exemplary relationship between the slot positions of the wafer boat 126 and the film thicknesses of films formed on the monitor wafers Wm arranged in the wafer boat 126 in the second processing. In the drawing, the horizontal axis represents the slot positions in the wafer boat 126 and the vertical axis represents the film thicknesses of the films formed on the monitor wafers Wm.

As described above, it is assumed that the film thickness at the slot position Wm8 in the second processing has not been measured. In this case, as illustrated in FIG. 7B, the film thickness at the slot position Wm8 in the second processing is estimated as 99.0 nm (see the asterisk) from the film thicknesses at the slot positions Wm6 and Wm7 adjacent to the slot position Wm8 measured in the second processing. Meanwhile, hereinafter, the film thickness at the asterisk of FIG. 7B is referred to as a second film thickness T2(Wm8).

In the present exemplary embodiment, although the film thickness at the slot position Wm8 was calculated via linear interpolation from the film thicknesses at adjacent slot positions, the present disclosure is not specifically limited thereto. In addition, an approximation formula may be obtained by, for example, minimum least squares using a plurality of plots and a value of the film thickness in the approximation formula may be employed.

Next, a difference between the film thickness of the film formed on the monitor wafer Wm placed at the slot position Wm8 measured in the second processing and the above-described second film thickness T2(Wm8) is calculated.

Figure 8A:
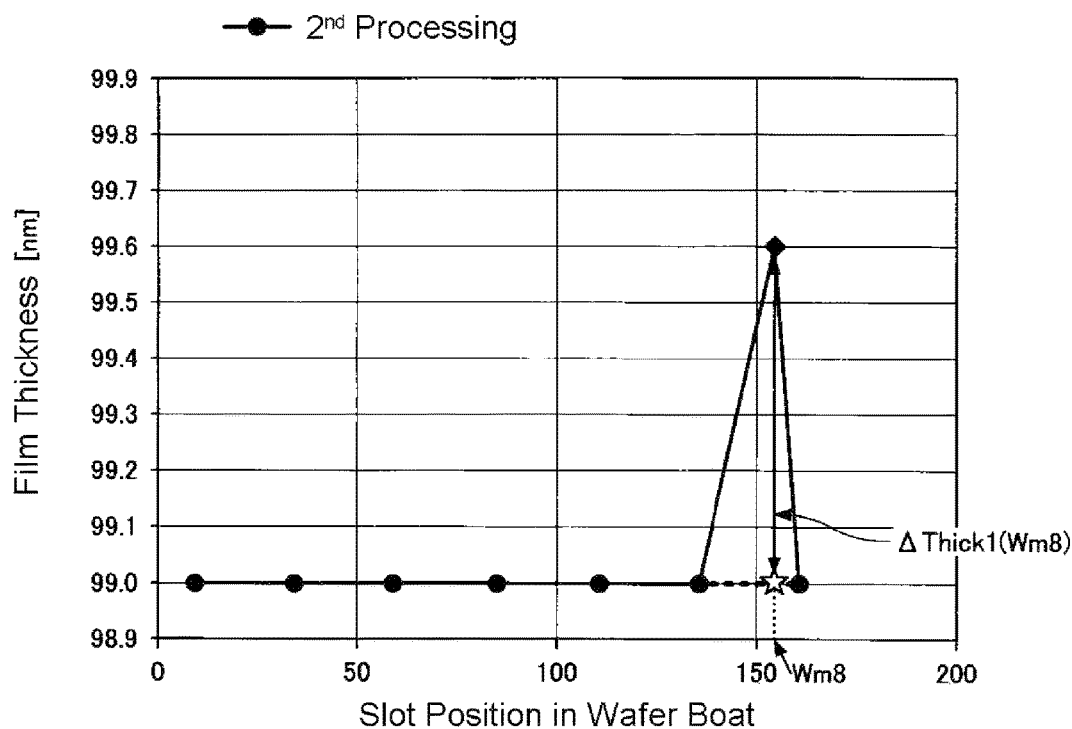
FIGS. 8A and 8B are explanatory views illustrating an exemplary substrate processing method according to the present exemplary embodiment.

FIG. 8A illustrates an exemplary relationship between the slot positions of the wafer boat 126 and the film thicknesses of films formed on the monitor wafers Wm arranged in the wafer boat 126 in the second processing.

As illustrated in FIG. 8A, in the present exemplary embodiment, a difference ΔThick1(Wm8) between the film thickness (black diamond mark) of the film formed on the monitor wafer Wm placed at the slot position Wm8, in which the film thickness is measured in the second processing, and the second film thickness T2(Wm8) (asterisk) is 0.6 nm (see the arrow in the drawing).

Next, assuming that there is no difference in processing condition (heater temperature) between the first processing and the second processing, the film thickness (referred to as a correction film thickness) at the slot position Wm8 is calculated.

Figure 8B:
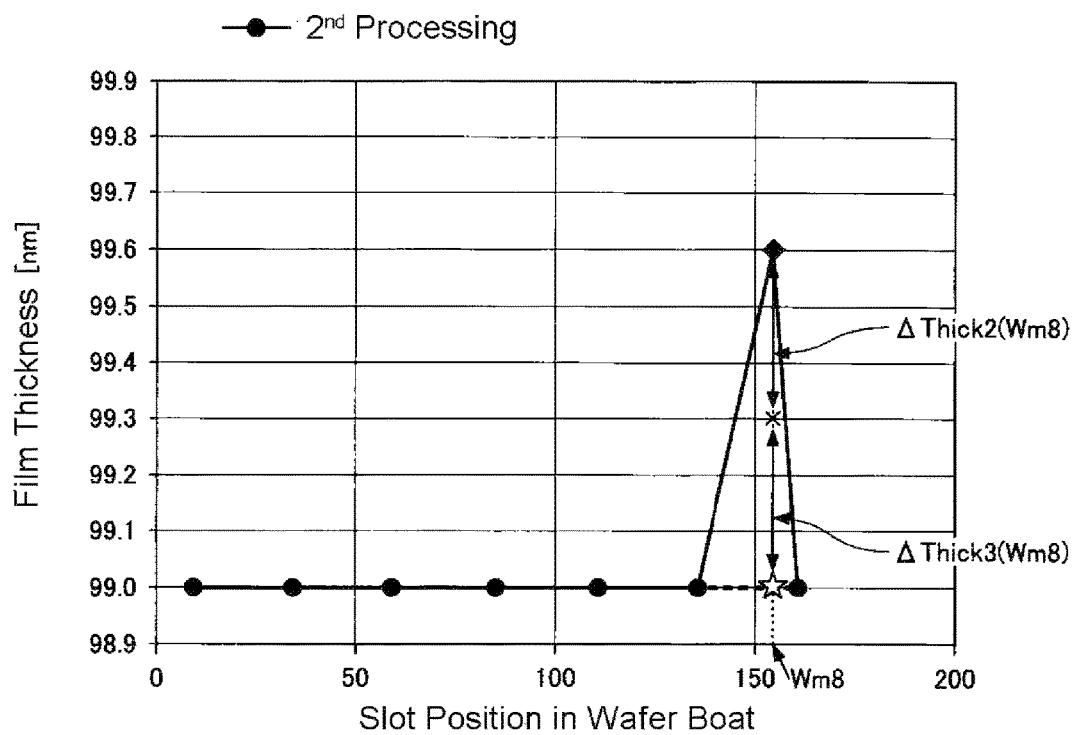

FIG. 8B illustrates an exemplary relationship between the slot positions of the wafer boat 126 and the film thicknesses of films formed on the monitor wafers Wm arranged in the wafer boat 126 in the second processing.

As illustrated in FIG. 8B, based on the difference ΔTemp between the heater temperature of the respective zones calculated in step S3 (see FIG. 7A) and the temperature-film thickness model stored in the above-described model storage unit 134, a film thickness correction amount ΔThick2(Wm8) is calculated (see the arrow in the drawing), in which the film thickness correction amount ΔThick2(Wm8) corresponds to a difference between the film thickness at the slot position Wm8 in a case where the second processing is performed under the same processing condition as the first processing and the actual film thickness at the slot position Wm8 in the second processing. In the present exemplary embodiment, the film thickness correction amount ΔThick2(Wm8) is 0.3 nm.

Next, a difference between ΔThick1(Wm8) and ΔThick2(Wm8) as described above is calculated. In this way, an estimated film thickness undulation amount ΔThick3(Wm8) (see the arrow in the drawing) at the slot position Wm8 in the second processing is calculated. In the present exemplary embodiment, ΔThick3(Wm8) is 0.3 nm.

Next, based on the film thickness undulation amount ΔThick3(Wm8), the film thickness at the slot position Wm8 in the first processing is calculated (estimated).

Figure 9A:
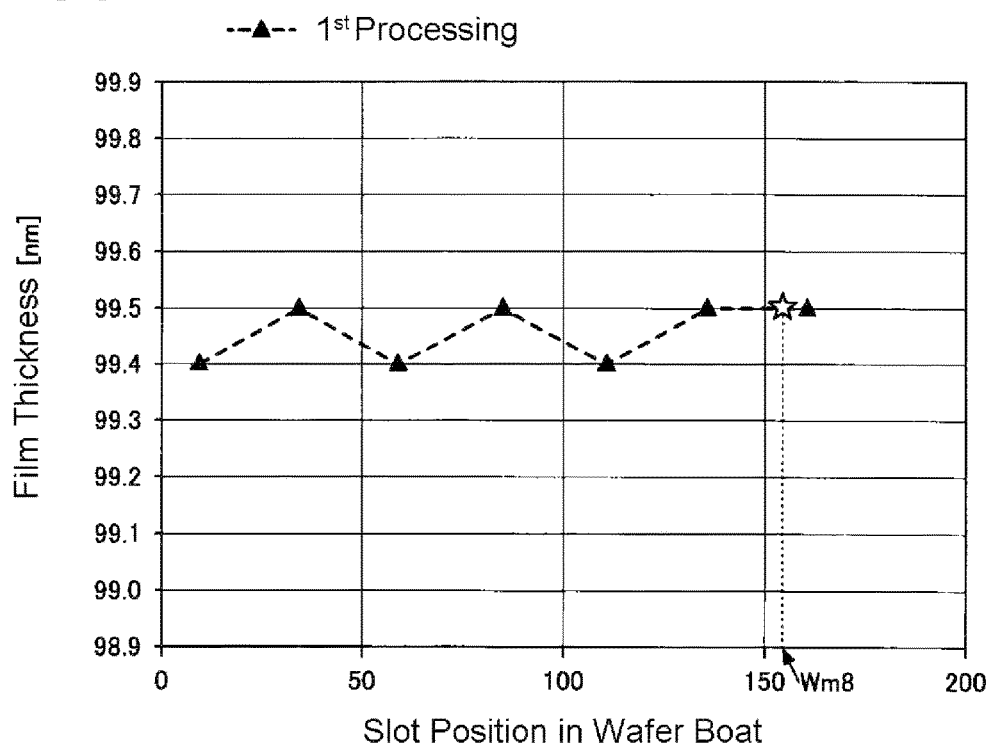
FIGS. 9A and 9B are explanatory views illustrating an exemplary substrate processing method according to the present exemplary embodiment.

FIG. 9A illustrates an exemplary relationship between the slot positions of the wafer boat 126 and the film thicknesses of films formed on the monitor wafers Wm arranged in the wafer boat 126 in the first processing is illustrated.

As illustrated in FIG. 9A, the film thickness at the slot position Wm8 in the second processing is estimated as 99.5 nm (asterisk) from the film thicknesses at the slot positions Wm6 and Wm7 adjacent to the slot position Wm8 measured in the first processing. Meanwhile, hereinafter, the film thickness at the asterisk in FIG. 9A is also referred to as a first film thickness T1 (Wm8).

Here, although the film thickness at the slot position Wm8 was calculated via linear interpolation from the film thicknesses at adjacent slot positions, the present disclosure is not specifically limited thereto.

Next, the film thickness at the slot position Wm8 in the first processing is calculated by adding the film thickness undulation amount ΔThick3(Wm8) to the first film thickness T1 (Wm8).

Figure 9B:
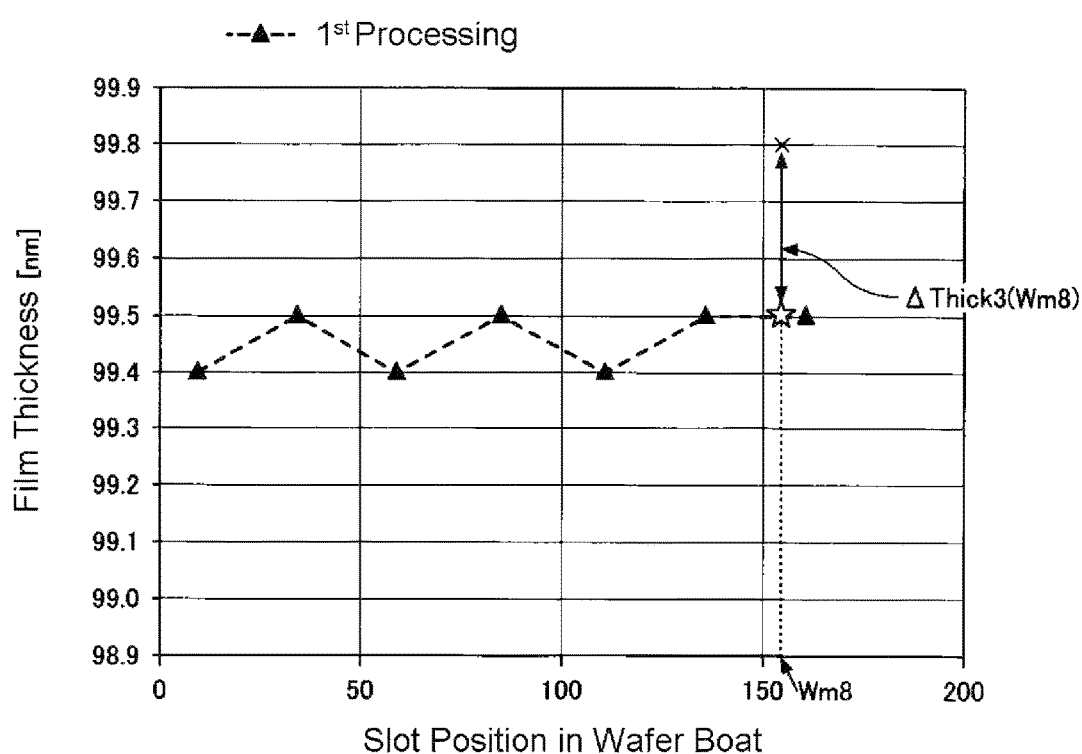

FIG. 9B illustrates an exemplary relationship between the slot positions in the wafer boat 126 and the film thicknesses of films formed on the monitor wafers Wm arranged in the wafer boat 126 in the first processing.

As illustrated in FIG. 9B, the film thickness Est (Wm8) (X-mark) at the slot position Wm8 in the first processing is 99.75 nm.

Through the steps as described above, the film thickness at the slot position Wm8 (non-measurement slot position) where no monitor wafer Wm is placed in the first processing may be calculated.

Meanwhile, although descriptions have been made on a case where there is a single non-measurement slot position in the present exemplary embodiment, the present disclosure is not limited thereto and the above-described substrate processing method may also be applied to a case where there is a plurality of non-measurement slot positions.

In addition, the second processing may be performed immediately after the introduction (installation) the substrate processing apparatus 100 into, for example, a factory or a laboratory. The phrase, "immediately after the introduction (installation) of the substrate processing apparatus 100," refers to a period until production of product wafers Wp is started after the substrate processing apparatus 100 is introduced (installed).

In addition, the second processing may be performed immediately after performing an overhaul on the substrate processing apparatus 100. In this way, the calculation precision of the film thickness at the non-measurement slot position in the first processing is further improved. Meanwhile, the phrase "immediately after performing an overhaul" refers to a period until production is restarted after the overhaul is performed.

In addition, the second processing may be performed whenever a processing condition greatly varies, for example, whenever the heater temperature of the same zone varies by 20° C. In addition, the second processing may be performed whenever at least one condition varies in a case where there are a plurality of processing conditions including, for example, temperature, pressure, gas flow rate, and time. In this way, the calculation precision of the film thickness at the non-measurement slot position in the first processing is further improved.

In addition, although descriptions have been described on a film forming process as a substrate processing in the present exemplary embodiment by way of an example, the present exemplary embodiment is not limited thereto and may be applied to a diffusion processing or an etching processing.

(Application Example of Substrate Processing Method)

Next, an application example of a substrate processing method according to the present exemplary embodiment will be described with reference to FIG. 10.

Figure 10:
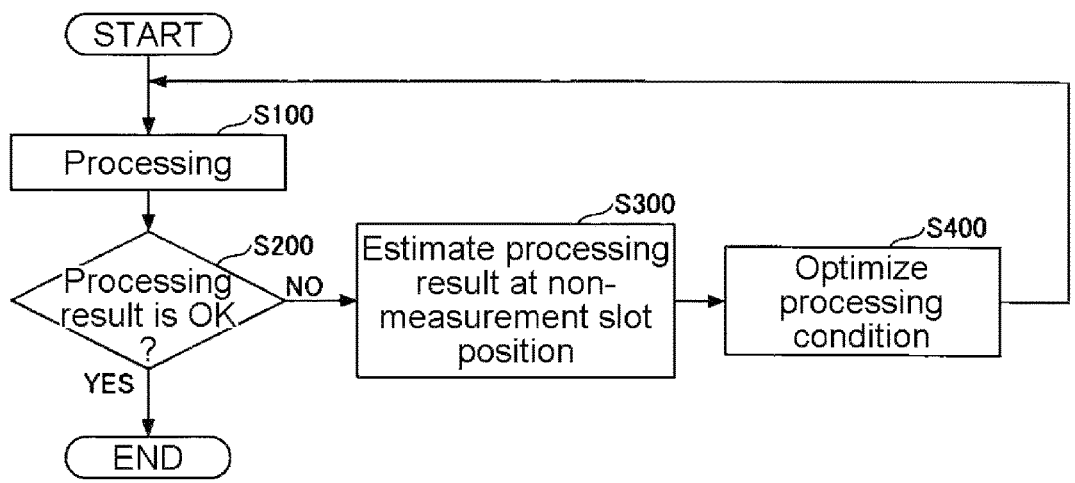
FIG. 10 is a flowchart illustrating an application example of a substrate processing method according to the present exemplary embodiment.

FIG. 10 is a flowchart illustrating an application example of a substrate processing method according to the present exemplary embodiment.

When the substrate processing method according to the present exemplary embodiment is applied, a control unit of a host computer issues an instruction to the control unit 132 of the substrate processing apparatus 100. With this instruction, the CPU 144 reads a processing condition of a substrate processing in response to input instruction contents from the recipe storage unit 136. Meanwhile, an instruction may be given to the control unit 132 as an operator operates the operating panel 148.

Subsequently, the CPU 144 sets the temperature within the processing container 102 by the heater 128 based on a determined processing condition. Then, a predetermined number of wafers W including at least the monitor wafers Wm as monitor substrates are arranged in the wafer boat 126 and the cover 120 is raised by the elevating mechanism 122. Then, the CPU 144 loads the wafers W to the processing container 102 and brings the interior of the processing container 102 in a hermetically sealed state.

After the loading of the wafers W is completed, the CPU 144 sets the interior of the processing container 102 to a condition according to the read processing condition. The processing condition includes, for example, an opening degree of the opening-variable valve 114. Then, the CPU 144 supplies a predetermined amount of a processing gas to the processing container 102 according to a recipe and performs a substrate processing (S100).

Subsequently, the CPU 144 determines whether the substrate processing is terminated and, when the substrate processing is determined, stops the supply of the processing gas. Then, the CPU 144 cools the interior of the processing container 102 so as to set the temperature within the processing container 102 to an unload temperature determined as a processing condition and, unloads the wafer boat 126.

After unloading the wafer boat 126, the CPU 144 takes the monitor wafers Wm out of the wafer boat 126, acquires a processing result of formed films, and determines whether the processing result has a problem (S200).

When the processing result of the films formed on the monitor wafers Wm has no problem, the CPU 144 terminates the processing or performs a subsequent processing.

Meanwhile, when the processing result of the films formed on the monitor wafers Wm has a problem, the CPU 144 calculates the processing result at a slot position (non-measurement slot position) where no monitor wafer Wm is placed using the above-described substrate processing method including steps S1 to S4 (S300).

Next, the CPU 144 optimizes the processing condition based on the measured processing result of the monitor wafers Wm and the calculated processing result at the non-measurement slot position.

Next, the CPU 144 performs a subsequent processing based on the optimized processing condition (S100).

The substrate processing method according to the present exemplary embodiment is applied as described above In this way, through the application example of the substrate processing method according to the present exemplary embodiment, a substrate processing result in a process region (a processing result at a non-measurement slot position) may be determined using a small number of monitor substrates. In addition, since an adjustment or optimization of a processing condition is performed based on the processing result (a measured processing result of the wafer monitors Wm and a calculated processing result at the non-measurement slot position), inter-plane uniformity may be improved in a processing that is performed using the adjusted or optimized processing condition.

EXAMPLE

Figure 11A:
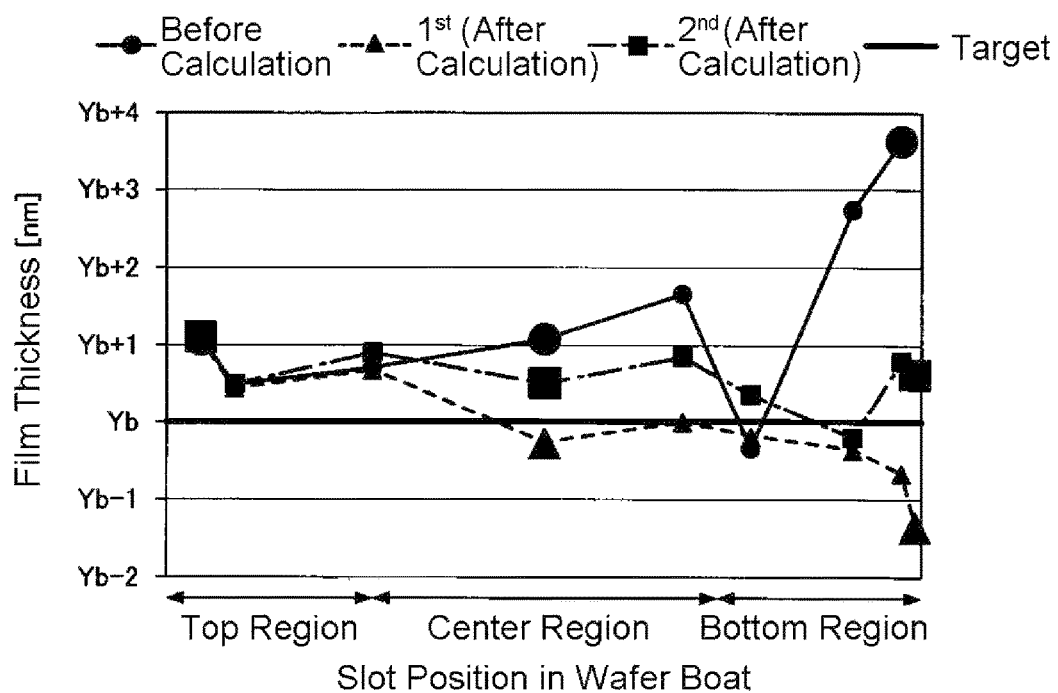
FIGS. 11A and 11B are graphs illustrating an exemplary evaluation result of face-to-face uniformity according to an exemplary embodiment.

An example using the substrate processing method according to the present exemplary embodiment as described above will be described with reference to FIGS. 11A and 11B. FIG. 11A illustrates measured results of the film thicknesses of films formed on the wafers W arranged in the top region, the center region, and the bottom region of the wafer boat 126 after a predetermined film forming processing is performed. More specifically, FIG. 11A illustrates a relationship between the slot positions of the wafer boat 126 and the film thicknesses of films formed on the monitor wafers Wm arranged in the wafer boat 126 before an application (calculation) of a processing based on the above-described substrate processing method (black circular marks), after a first application (calculation) of the processing (black triangular marks), and after a second application (calculation) of the processing (black square marks).

In the example illustrated in FIG. 11A, the film forming processing was performed so as to form a film having a film thickness Yb (nm) (thick solid line) on each wafer W. Meanwhile, in this example, eight (8) monitor wafers Wm were arranged in the wafer boat 126 by way of an example, and the film thicknesses of films formed on three monitor wafers Wm (large black circular marks) among the eight monitor wafers Wm were applied to the substrate processing method according to the present exemplary embodiment as described above. Meanwhile, small black circular marks are data which were used only for calculation of inter-plane uniformity illustrated in FIG. 11B without being used when the film thickness of the films formed on the monitor wafers Wm are applied to the above-described substrate processing method.

As illustrated in FIG. 11A, it has been found that variation in film thicknesses of the films formed on the wafers W arranged in the wafer boat 126 becomes less when the processing based on the substrate processing method according to the present exemplary embodiment as described above is applied. In particular, it has been found that deviation from the target film thickness Yb of the films formed on the wafers W arranged in the bottom region is considerably reduced.

Figure 11B:
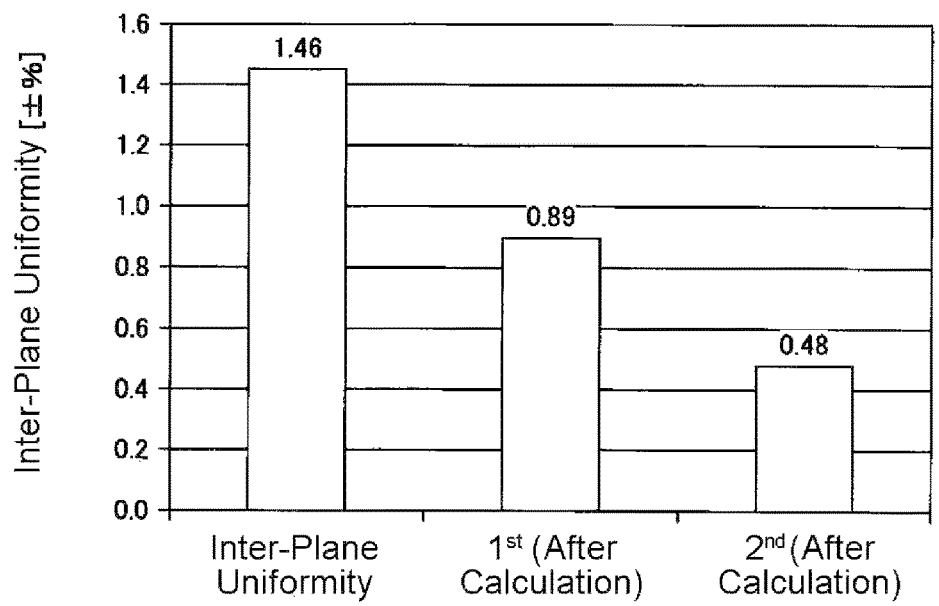

FIG. 11B illustrates inter-plane uniformity in terms of film thickness before and after application of the processing based on the above-described substrate processing method. As illustrated in FIG. 11B, the inter-plane uniformity is a value calculated by the following Equation (1) using the maximum film thickness Tmax, the minimum film thickness Tmin and the average film thickness Tave based on respective processing results of the measured film thickness results (before application, after a first application, and after a second application) as illustrated in FIG. 11A.

$$(T\text{max}-T\text{min})/(T\text{ave}\times 2)\times 100[\%] \quad (1)$$

As illustrated in FIG. 11B, it has been found that the inter-plane uniformity is improved from ±1.46% to ±0.89% when the processing based on the substrate processing method according to the present exemplary embodiment is applied once. In addition, it has been found that the inter-plane uniformity is further improved from ±0.89% to ±0.48% when the processing based on the substrate processing method according to the present exemplary embodiment is applied twice.

That is, it has been found that the number of used monitor wafers Wm is reduced and the inter-plane uniformity is improved.

As described above, with a substrate processing method, a program, a control device, a substrate processing apparatus, and a substrate processing system according to the present exemplary embodiment, it is possible to provide a substrate processing method in which a processing result of a substrate in a process region may be determined using a small number of monitor substrates.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate processing method comprising:
providing a substrate processing apparatus including a processing container; a substrate holding mechanism provided in the processing container and having a plurality of slots each configured to load one of a product substrate and a monitor substrate therein, the plurality of slots being provided in a vertical direction within the substrate holding mechanism; a cylindrical heater provided to surround the processing container and divided into a plurality of zones having a plurality of local heaters, respectively; and a controller including a model storage unit, a recipe storage unit, a memory and a processor coupled to the memory, the controller being configured to control an overall operation of the substrate processing apparatus;

retrieving, by the processor, a process model from the model storage unit, wherein the process model includes a relationship between a temperature set by each of the local heaters of the plurality of zones of the cylindrical heater and a thickness of film formed on each of a plurality of product substrates being arranged to be processed within the substrate holding mechanism of the processing container at the set temperature, wherein the product substrates are used for manufacturing a semiconductor device, respectively;

after the retrieving the process model, acquiring, by the processor, from the recipe storage unit a first temperature of each of the plurality of local heaters in a first processing performed using a first number of monitor substrates arranged in a first number of slots among the plurality of slots, respectively within the substrate holding mechanism, and also acquiring from the recipe storage unit a first thickness of a film formed on each of the first number of monitor substrates during the first processing at the first temperature, the monitor substrate being used to monitor whether a desired substrate processing is performed on the product substrate;

when the first processing results in a variation of a first thickness of a film formed on each of the first number of monitor substrates beyond a predetermined variation amount with reference to a target film thickness, performing a second processing;

acquiring, by the processor, from the recipe storage unit a second temperature of each of the plurality of local heaters for the second processing performed using a second number of monitor substrates arranged in a second number of slots among the plurality of slots, respectively within the substrate holding mechanism, wherein the second number of monitor substrates is larger than the first number of monitor substrates, and also acquiring from the recipe storage unit a second thickness of film formed on each of the second number of monitor substrates during the second processing at the second temperature;

after the acquiring the second temperature and the second thickness, acquiring, by the processor, a temperature difference between the first temperature of each of the plurality of local heaters in the first processing and the second temperature of each of the plurality of local heaters in the second processing;

after the acquiring the temperature difference, acquiring in the second processing, by the processor, a second thickness of a film that would be formed on a product substrate loaded in a slot among the plurality of slots where no monitor substrate has been placed during the first processing (non-measurement slot), based on a linear interpolation using thicknesses of at least two films respectively formed on product substrates loaded in at least two slots adjacent to the non-measurement slot of the first processing, respectively; and after the acquiring the second thickness, acquiring, by the processor, a first difference between a thickness of a film formed on a monitor substrate loaded in the non-measurement slot of the first processing that is estimated in the second processing, and the second thickness of the film;

after the acquiring the first difference, acquiring, by the processor, a correction amount of film thickness corresponds to a difference between a thickness of a film formed on the product substrate loaded in the non-measurement slot of the first processing when the second processing is performed under the same temperature as the first temperature of each of the plurality of local heaters in the first processing, and a thickness of the film formed on the product substrate loaded in the non-measurement slot of the first processing when the second processing is performed under the second temperature different from the first temperature;

after the acquiring the correction amount of film thickness, acquiring, by the processor, a second difference between the first difference and the correction amount of film thickness, thereby obtaining a film thickness undulation amount in the non-measurement slot of the first processing, in the second processing;

after the obtaining the film thickness undulation amount, acquiring in the first processing, by the processor, a first thickness of a film that would be formed on a product substrate loaded in the non-measurement slot of the first processing based on the linear interpolation using thicknesses of at least two films respectively formed on product substrates that are respectively loaded in at least two slots adjacent to the non-measurement slot of the first processing;

after the acquiring the first thickness, adding, by the processor, the film thickness undulation amount obtained in the second processing to the first thickness of the film estimated in the first processing, thereby acquiring a thickness of a film formed on the product substrate loaded in the non-measurement slot of the first processing while reducing the first number of monitor substrates and the second number of monitor substrates; and optimizing a processing condition of a subsequent substrate processing, which includes a subsequent temperature of each of the plurality of local heaters, based on the acquired thickness of the film formed on the product substrate loaded in the non-measurement slot of the first processing, such that a variation amount of a thickness of a film formed on each of the monitor substrates with reference to the target film thickness in the subsequent substrate processing becomes less than the predetermined variation amount with reference to the target film thickness.

2. The substrate processing method of claim 1, wherein slots among the plurality of slots where the monitor substrates are placed in the second processing include slots among the plurality of slots where the monitor substrates are placed in the first processing.

3. A non-transitory computer-readable storage medium which stores a program that is executed in a computer so as to cause the computer to execute the substrate processing method of claim 1.

4. A control device for controlling an operation of a substrate processing apparatus,
the substrate processing apparatus including:
a processing container;
a substrate holding mechanism provided in the processing container and having a plurality of slots each configured to load one of a product substrate and a monitor substrate therein, the plurality of slots being provided in a vertical direction within the substrate holding mechanism; and
a cylindrical heater provided to surround the processing container and divided into a plurality of zones having a plurality of local heaters, respectively, and
the control device comprising a model storage unit, a recipe storage unit, a memory and a processor coupled to the memory, the control device being configured to control an overall operation of the substrate processing apparatus wherein the processor of the control device is configured to:

retrieve a process model from the model storage unit, wherein the process model includes a relationship between a temperature set by each of the local heaters of the plurality of zones of the cylindrical heater and a thickness of film formed on each of a plurality of product substrates being arranged to be processed within the substrate holding mechanism of the processing container at the set temperature, wherein the product substrate are used for manufacturing a semiconductor device, respectively;

after the process model is retrieved, acquire from the recipe storage unit a first temperature of each of the plurality of local heaters in a first processing performed using a first number of monitor substrates arranged in a first number of slots among the plurality of slots, respectively within the substrate holding mechanism, and also acquire from the recipe storage unit a first thickness of a film formed on each of the first number of monitor substrates during the first processing at the first temperature, the monitor substrate being used to monitor whether a desired substrate processing is performed on the product substrate;

when the first processing results in a variation of a first thickness of a film formed on each of the first number of monitor substrates beyond a predetermined variation amount with reference to a target film thickness, perform a second processing;

acquire from the recipe storage unit a second temperature of each of the plurality of local heaters for the second processing performed using a second number of monitor substrates arranged in a second number of slots among the plurality of slots, respectively within the substrate holding mechanism, wherein the second number of monitor substrates is larger than the first number of monitor substrates, and also acquire from the recipe storage unit a second thickness of film formed on each of the second number of monitor substrates during the second processing at the second temperature;

after the second temperature and the second thickness are acquired, acquire a temperature difference between the first temperature of each of the plurality of local heaters in the first processing and the second temperature of each of the plurality of local heaters in the second processing;

after the temperature difference is acquired, acquire, in the second processing, a second thickness of a film that would be formed on a product substrate loaded in a slot among the plurality of slots where no monitor substrate has been placed during the first processing (non-measurement slot), based on a linear interpolation using thicknesses of at least two films respectively formed on product substrates loaded in at least two slots adjacent to the non-measurement slot of the first processing, respectively;

after the second thickness is acquired, acquire a first difference between a thickness of a film formed on a monitor substrate loaded in the non-measurement slot of the first processing that is estimated in the second processing, and the second thickness of the film;

after the first difference is acquired, acquire a correction amount of film thickness corresponds to a difference between a thickness of a film formed on the product substrate loaded in the non-measurement slot of the first processing when the second processing is performed under the same temperature as the first temperature of each of the plurality of local heaters in the first processing, and a thickness of the film formed on the product substrate loaded in the non-measurement slot of the first processing when the second processing is performed under the second temperature different from the first temperature;

after the correction amount of film thickness is acquired, acquire a second difference between the first difference and the correction amount of film thickness, thereby obtaining a film thickness undulation amount in the non-measurement slot of the first processing, in the second processing;

after the film thickness undulation amount is obtained, acquire in the first processing, by the processor, a first thickness of a film that would be formed on a product substrate loaded in the non-measurement slot of the first processing based on the linear interpolation using thicknesses of at least two films respectively formed on product substrates that are respectively loaded in at least two slots adjacent to the non-measurement slot of the first processing;

after the first thickness is acquired, add the film thickness undulation amount obtained in the second processing to the first thickness of the film estimated in the first processing, thereby acquiring a thickness of a film formed on the product substrate loaded in the non-measurement slot of the first processing while reducing the first number of monitor substrates and the second number of monitor substrates; and optimize a processing condition of a subsequent substrate processing, which includes a subsequent temperature of each of the plurality of local heaters, based on the acquired thickness of the film formed on the product substrate loaded in the non-measurement slot of the first processing, such that a variation amount of a thickness of a film formed on each of the monitor substrates with reference to the target film thickness in the subsequent substrate processing becomes less than the predetermined variation amount with reference to the target film thickness.

5. A substrate processing apparatus comprising:
a processing container;
a substrate holding mechanism provided in the processing container and having a plurality of slots each configured to load one of a product substrate and a monitor substrate therein, the plurality of slots being provided in a vertical direction within the substrate holding mechanism;
a cylindrical heater provided to surround the processing container and divided into a plurality of zones having a plurality of local heaters, respectively; and
a controller including a model storage unit, a recipe storage unit, a memory and a processor coupled to the memory, the controller being configured to control an overall operation of the substrate processing apparatus,
wherein the processor of the controller is configured to:
retrieve a process model from the model storage unit, wherein the process model includes a relationship between a temperature set by each of the local heaters of the plurality of zones of the heater and a thickness of film formed on each of a plurality of product substrates being arranged to be processed within the substrate holding mechanism of the processing container at the set temperature, wherein the product substrate are used for manufacturing a semiconductor device, respectively;

after the process model is retrieved, acquire from the recipe storage unit a first temperature of each of the plurality of local heaters in a first processing performed using a first number of monitor substrates arranged in a first number of slots among the plurality of slots, respectively within the substrate holding mechanism, and also acquire from the recipe storage unit a first thickness of a film formed on each of the first number of monitor substrates during the first processing at the first temperature, the monitor substrate being used to monitor whether a desired substrate processing is performed on the product substrate;

when the first processing results in a variation of a first thickness of a film formed on each of the first number of monitor substrates beyond a predetermined variation amount with reference to a target film thickness, perform a second processing;

acquire from the recipe storage unit a second temperature of each of the plurality of local heaters for the second processing performed using a second number of monitor substrates arranged in a second number of slots among the plurality of slots, respectively within the substrate holding mechanism, wherein the second number of monitor substrates is larger than the first number of monitor substrates, and also acquire from the recipe storage unit a second thickness of film formed on each of the second number of monitor substrates during the second processing at the second temperature;

after the second temperature and the second thickness are acquired, acquire a temperature difference between the first temperature of each of the plurality of local heaters in the first processing and the second temperature of each of the plurality of local heaters in the second processing;

after the temperature difference is acquired, acquire, in the second processing, a second thickness of a film that would be formed on a product substrate loaded in a slot among the plurality of slots where no monitor substrate has been placed during the first processing (non-measurement slot), based on a linear interpolation using thicknesses of at least two films respectively formed on product substrates that are respectively loaded in at least two slots adjacent to the non-measurement slot of the first processing;

after the second thickness is acquired, acquire a first difference between a thickness of a film formed on a monitor substrate loaded in the non-measurement slot of the first processing that is estimated in the second processing, and the second thickness of the film;

after the first difference is acquired, acquire a correction amount of film thickness corresponds to a difference between a thickness of a film formed on the product substrate loaded in the non-measurement slot of the first processing when the second processing is performed under the same temperature as the first temperature of each of the plurality of local heaters in the first processing, and a thickness of the film formed on the product substrate loaded in the non-measurement slot of the first processing when the second processing is performed under the second temperature different from the first temperature;

after the correction amount of film thickness is acquired, acquire a second difference between the first difference and the correction amount of film thickness, thereby obtaining a film thickness undulation amount in the non-measurement slot of the first processing, in the second processing;

after the film thickness undulation amount is obtained, acquire, in the first processing, a first thickness of a film that would be formed on a product substrate loaded in the non-measurement slot of the first processing based on the linear interpolation using thicknesses of at least two films respectively formed on product substrates that are respectively loaded in at least two slots adjacent to the non-measurement slot of the first processing;

after the first thickness is acquired, add the film thickness undulation amount obtained in the second processing to the first thickness of the film estimated in the first processing, thereby acquiring a thickness of a film formed on the product substrate loaded in the non-measurement slot of the first processing while reducing the first number of monitor substrates and the second number of monitor substrates; and optimize a processing condition of a subsequent substrate processing, which includes a subsequent temperature of each of the plurality of local heaters, based on the acquired thickness of the film formed on the product substrate loaded in the non-measurement slot of the first processing, such that a variation amount of a thickness of a film formed on each of the monitor substrates with reference to the target film thickness in the subsequent substrate processing becomes less than the predetermined variation amount with reference to the target film thickness.

6. A substrate processing system comprising:

a substrate processing apparatus capable of processing substrates, the apparatus including:

a processing container;

a substrate holding mechanism provided in the processing container and having a plurality of slots each configured to load one of a product substrate and a monitor substrate therein, the plurality of slots being provided in a vertical direction within the substrate holding mechanism;

a cylindrical heater provided to surround the processing container and divided into a plurality of zones having a plurality of local heaters, respectively; and a controller including a model storage unit, a recipe storage unit, a memory and a processor coupled to the memory, the controller being configured to control an overall operation of the substrate processing apparatus, wherein the processor of the controller is configured to:

retrieve a process model from the model storage unit, wherein the process model includes a relationship between a temperature set by each of the local heaters of the plurality of zones of the cylindrical heater and a thickness of film formed on each of a plurality of product substrates being arranged to be processed within the substrate holding mechanism of the processing container at the set temperature, wherein the product substrate are used for manufacturing a semiconductor device, respectively;

after the process model is retrieved, acquire from the recipe storage unit a first temperature of each of the plurality of local heaters in a first processing performed using a first number of monitor substrates arranged in a first number of slots among the plurality of slots, respectively within the substrate holding mechanism, and also acquire from the recipe storage unit a first thickness of a film formed on each of the first number of monitor substrates during the first processing at the first temperature, the monitor substrate being used to monitor whether a desired substrate processing is performed on the product substrate;

when the first processing results in a variation of a first thickness of a film formed on each of the first number of monitor substrates beyond a predetermined variation amount with reference to a target film thickness, perform a second processing;

acquire from the recipe storage unit a second temperature of each of the plurality of local heaters the second processing performed using a second number of monitor substrates arranged in a second number of slots among the plurality of slots, respectively within the substrate holding mechanism, wherein the second number of monitor substrates is larger than the first number of monitor substrates, and also acquire from the recipe storage unit a second thickness of film formed on each of the second number of monitor substrates during the second processing at the second temperature;

after the second temperature and the second thickness are acquired, acquire a temperature difference between the first temperature of each of the plurality of local heaters in the first processing and the second temperature of each of the plurality of local heaters in the second processing;

after the temperature difference is acquired, acquire in the second processing, a second thickness of a film that would be formed on a product substrate loaded in a slot among the plurality of slots where no monitor substrate has been placed during the first processing (non-measurement slot), based on a linear interpolation using thicknesses of at least two films respectively formed on product substrates that are respectively loaded in at least two slots adjacent to the non-measurement slot of the first processing;

after the second thickness is acquired, acquire a first difference between a thickness of a film formed on a monitor substrate loaded in the non-measurement slot of the first processing that is estimated in the second processing, and the second thickness of the film;

after the first difference is acquired, acquire a correction amount of film thickness corresponds to a difference between a thickness of a film formed on the product substrate loaded in the non-measurement slot of the first processing when the second processing is performed under the same temperature as the first temperature of each of the plurality of local heaters in the first processing, and a thickness of the film formed on the product substrate loaded in the non-measurement slot of the first processing when the second processing is performed under the second temperature different from the first temperature;

after the correction amount of film thickness is acquired, acquire a second difference between the first difference and the correction amount of film thickness, thereby obtaining a film thickness undulation amount in the non-measurement slot of the first processing, in the second processing;

after the film thickness undulation amount is obtained, acquire in the first processing, by the processor, a first thickness of a film that would be formed on a product substrate loaded in the non-measurement slot of the first processing based on the linear interpolation using thicknesses of at least two films respectively formed on product substrates that are respectively loaded in the slots adjacent to the non-measurement slot of the first processing;
after the first thickness is acquired, add the film thickness undulation amount obtained in the second processing to the first thickness of the film estimated in the first processing, thereby acquiring a thickness of a film formed on the product substrate loaded in the non-measurement slot of the first processing while reducing the first number of monitor substrates and the second number of monitor substrates; and
optimize a processing condition of a subsequent substrate processing, which includes a subsequent temperature of each of the plurality of local heaters, based on the acquired thickness of the film formed on the product substrate loaded in the non-measurement slot of the first processing, such that a variation amount of a thickness of a film formed on each of the monitor substrates with reference to the target film thickness in the subsequent substrate processing becomes less than the predetermined variation amount with reference to the target film thickness.

\* \* \* \* \*